United States Patent [19]

Yee

[11] Patent Number: 5,679,598
[45] Date of Patent: Oct. 21, 1997

[54] METHOD OF MAKING A CMOS DYNAMIC RANDOM-ACCESS MEMORY (DRAM)

[75] Inventor: Abraham Yee, Santa Clara, Calif.

[73] Assignee: LSI Logic Corporation, Milpitas, Calif.

[21] Appl. No.: 366,804

[22] Filed: Dec. 30, 1994

[51] Int. Cl.⁶ .................................................. H01L 21/8242
[52] U.S. Cl. .................................. 437/60; 437/44; 437/56
[58] Field of Search .................................. 437/44, 47, 48, 437/52, 56, 60, 919

[56] References Cited

U.S. PATENT DOCUMENTS

| | | | |
|---|---|---|---|
| Re. 31,079 | 11/1982 | Nagasawa et al. | 29/571 |
| 4,366,613 | 1/1983 | Ogura et al. | 437/44 |
| 4,435,895 | 3/1984 | Parrillo et al. | 437/56 |
| 4,577,390 | 3/1986 | Haken | 437/56 |
| 4,728,619 | 3/1988 | Pfiester et al. | 437/56 |
| 4,761,384 | 8/1988 | Neppl et al. | 437/29 |
| 4,786,609 | 11/1988 | Chen | 437/44 |
| 4,929,565 | 5/1990 | Parrillo | 437/56 |
| 5,153,685 | 10/1992 | Murata et al. | 257/307 |
| 5,223,729 | 6/1993 | Kudoh et al. | 257/308 |
| 5,283,203 | 2/1994 | Gill et al. | 437/34 |
| 5,296,390 | 3/1994 | Park | 437/52 |
| 5,389,558 | 2/1995 | Suwamau et al. | 437/52 |

*Primary Examiner*—Chandra Chaudhari
*Attorney, Agent, or Firm*—Oppenheimer Poms Smith

[57] ABSTRACT

A CMOS-technology, DRAM integrated circuit includes paired P-type and N-type wells in a substrate, which wells are fabricated using a self-aligning methodology. Similarly, FET's of the DRAM circuit are fabricated in the wells of the substrate using a self-aligning methodology to provide FET's of opposite polarity in a DRAM which may have paired memory cells and dummy cells for symmetry of circuitry. The DRAM includes a multitude of capacitor structures formed atop the FET's of the substrate, and plural layers of insulative dielectric with embedded bit and word traces providing for connection of the multitude of memory cells of the DRAM to external circuitry.

19 Claims, 10 Drawing Sheets

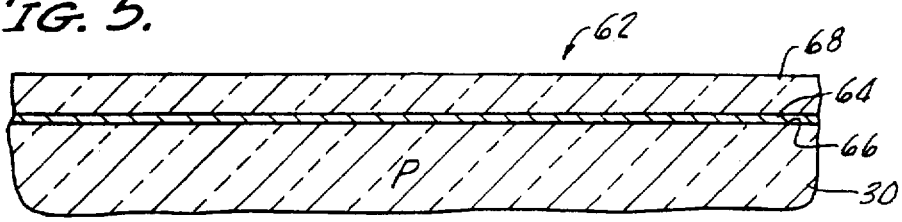
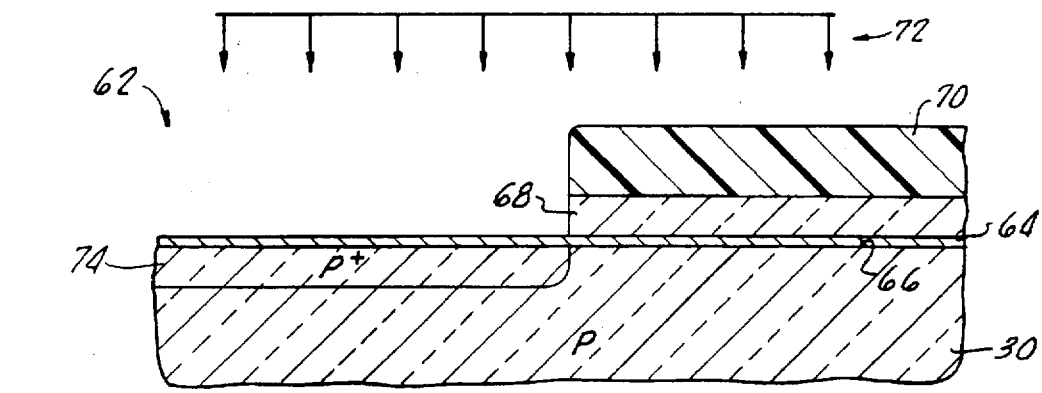
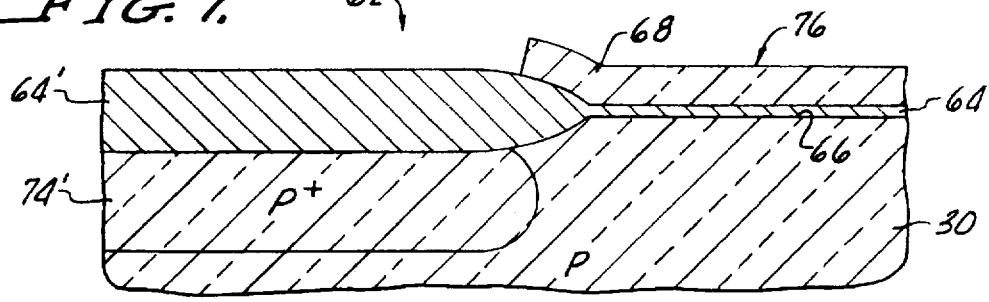
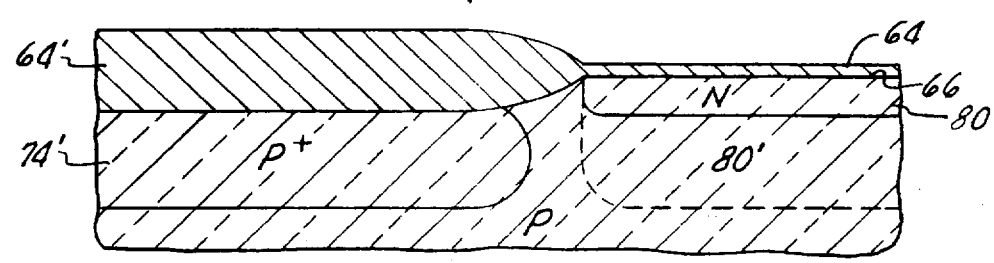

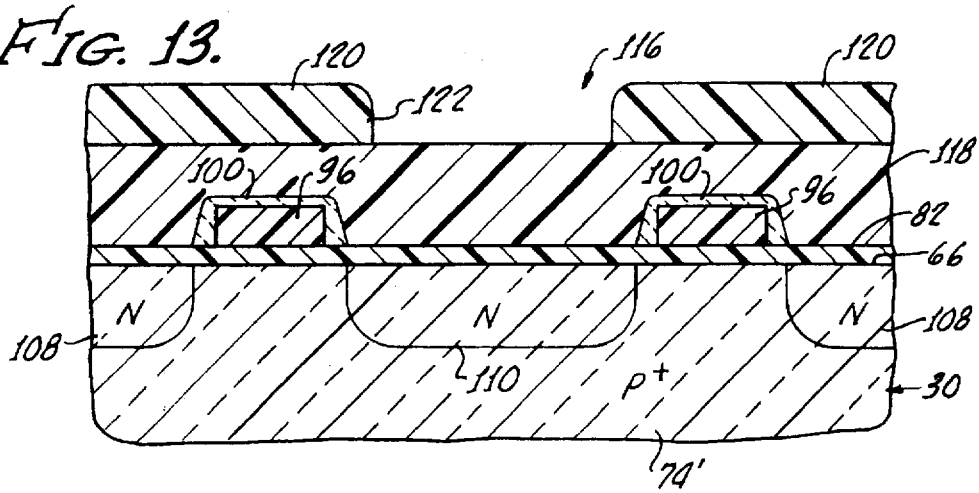
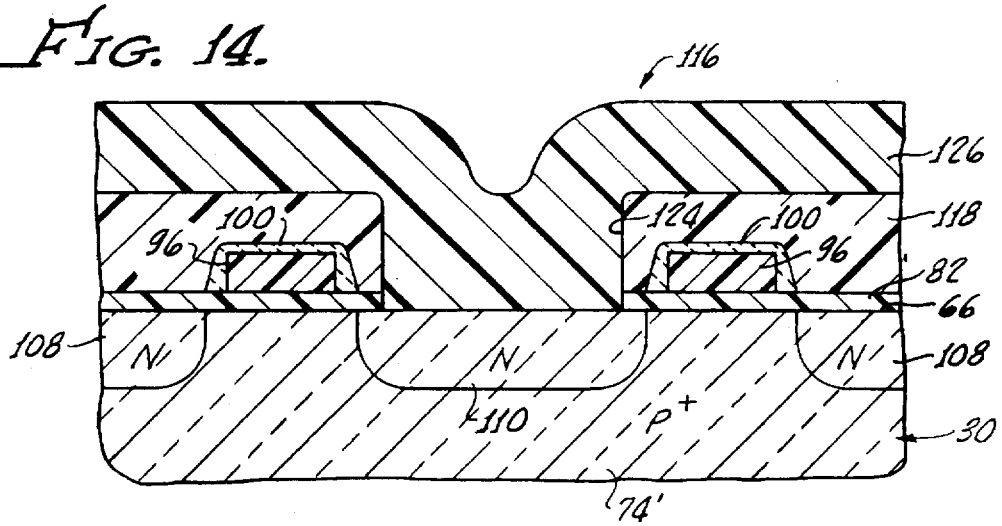
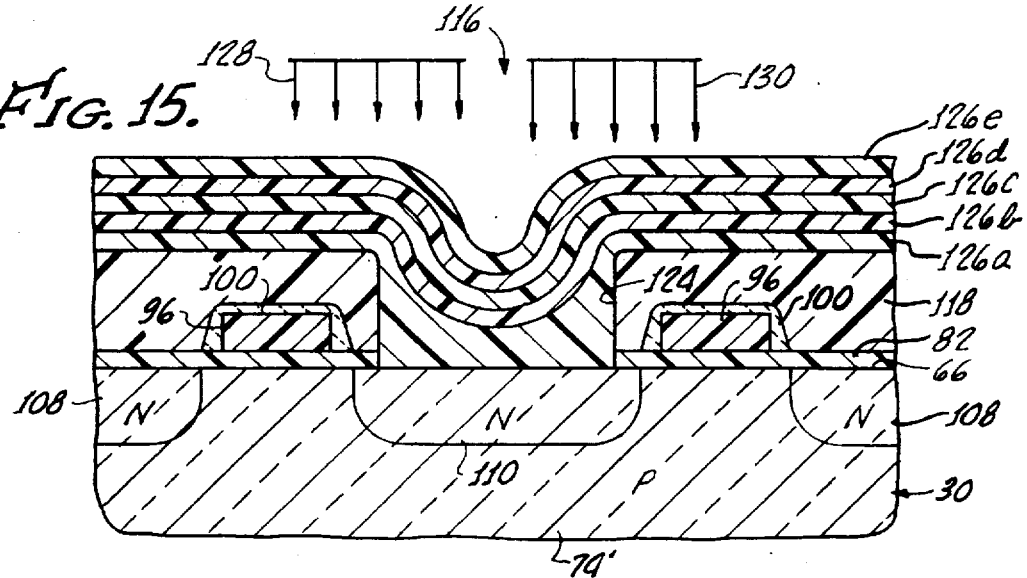

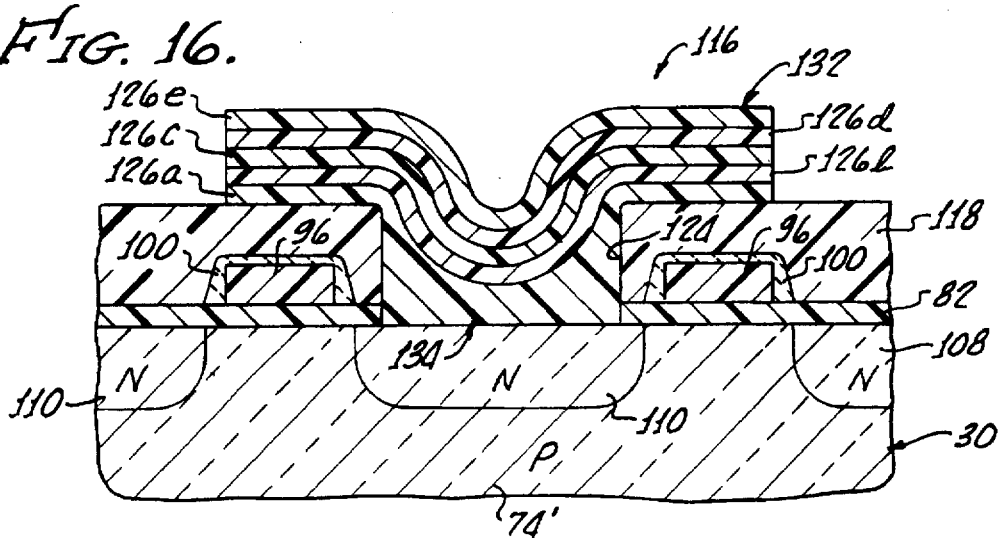
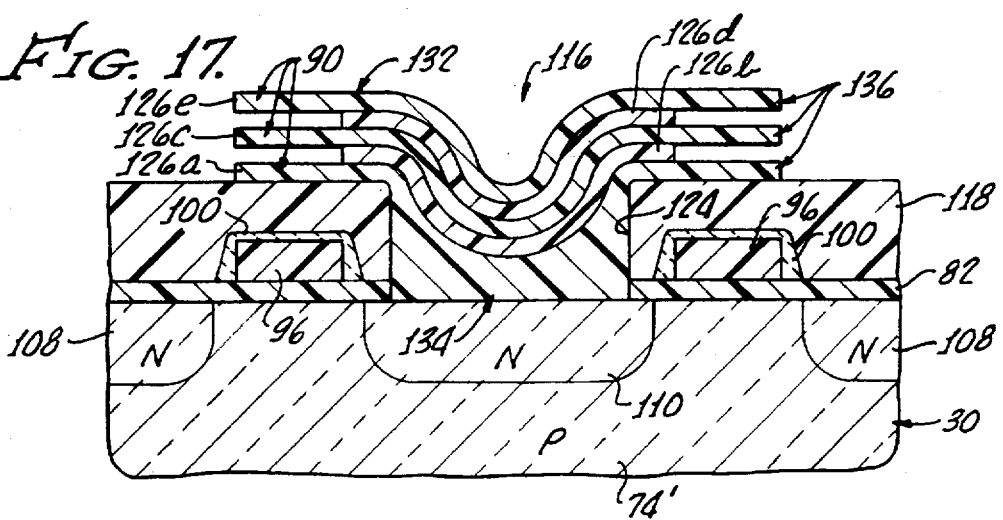
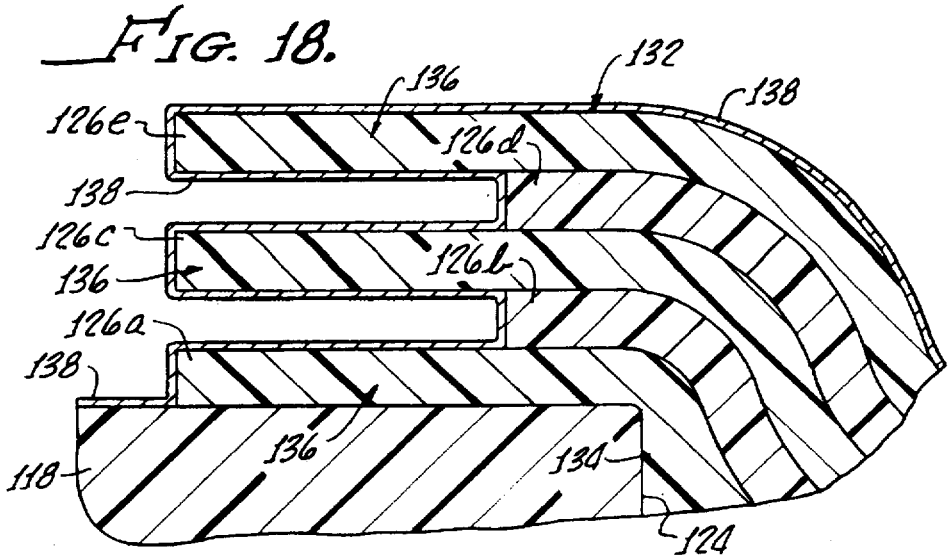

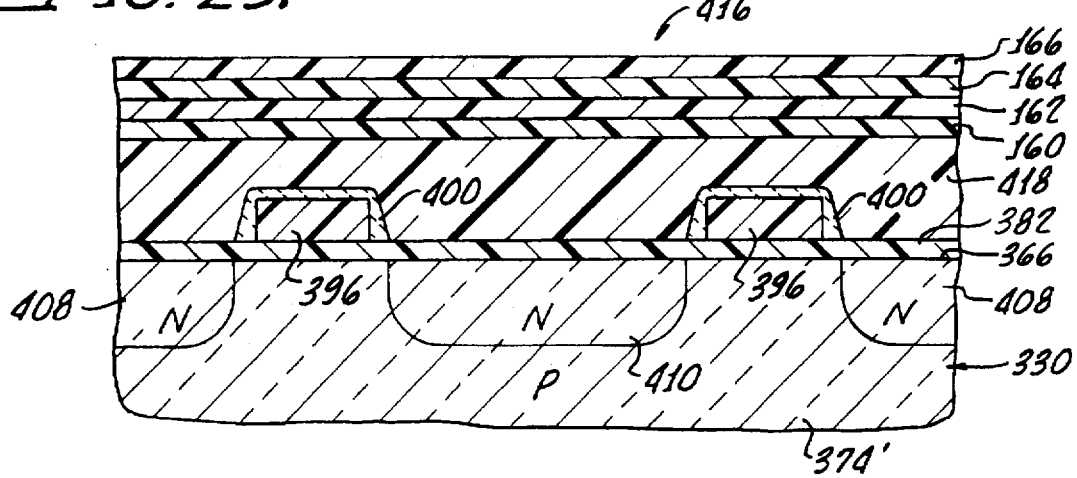
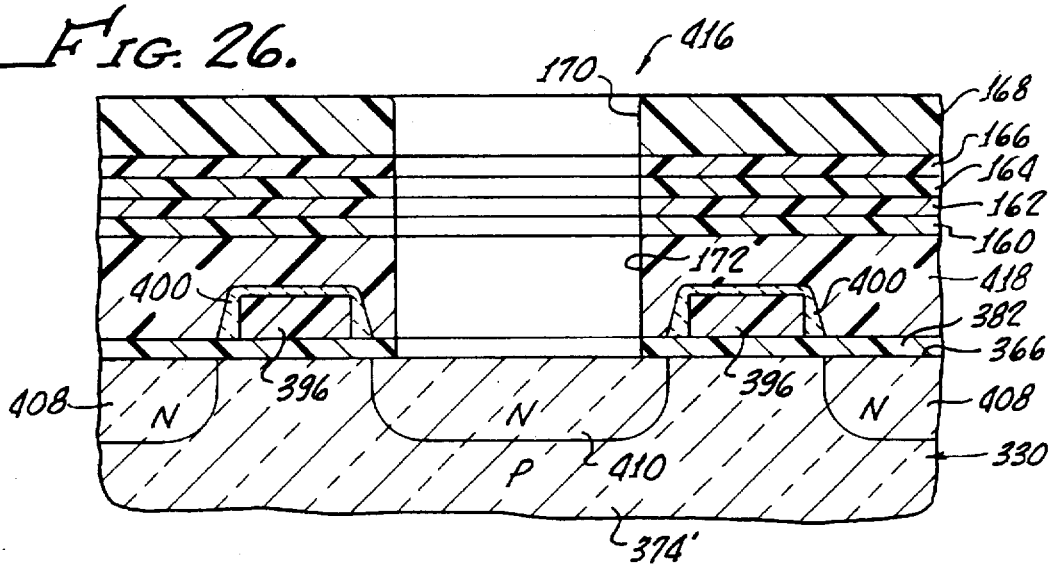
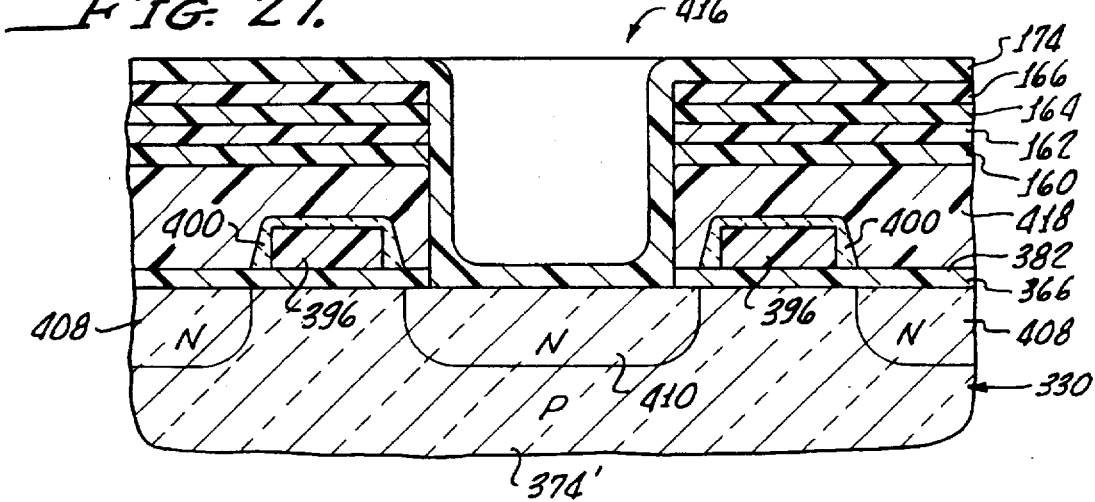

METHOD OF MAKING A CMOS DYNAMIC RANDOM-ACCESS MEMORY (DRAM)

BACKGROUND OF THE INVENTION

1. Field of the Invention

The present invention is in the field of complementary metal oxide semiconductor (CMOS), dynamic random-access memory (DRAM) integrated circuits. More particularly, the present invention relates to a method of making a CMOS DRAM memory circuit chip which includes field effect transistors (FET's), and a capacitor cooperatively defining a memory cell. Each of the FET's is paired with a capacitor to define one memory cell. A binary value (i.e., one or zero) is stored on the memory cell capacitor in the form of stored charge representing a voltage. A comparison charge value equal generally to one-half the voltage level of binary one may be simultaneously stored on a dummy cell capacitor. Thus, the stored value of one or zero can be determined after a time interval either be comparison to a reference voltage value or by comparison of the stored memory cell value to the dummy cell value. When the stored memory cell value is compared to the dummy cell stored value, a positive difference may represent a stored "one", for example, and a negative difference would then be equal to a stored "zero".

2. Related Technology

A conventional CMOS-technology integrated circuit device is known in accord with U.S. Pat. No. 4,435,895 (hereinafter, the '895 patent), issued 13 Mar. 1984, to Louis C. Parrillo, et al., and assigned to Bell Laboratories. The '895 patent is believed to disclose a CMOS-technology integrated circuit having complementary transistors formed in respective P-type and N-type tubs or wells of the integrated circuit. The '895 patent does not teach nor suggest the combination of a capacitor structure with the CMOS integrated circuit. The '895 patent does not teach nor suggest the formation of a DRAM memory cell by structuring a capacitor atop the substrate of the integrated circuit.

Another conventional CMOS-technology integrated circuit is known in accord with U.S. Pat. No. 4,761,384 (hereinafter, the '384 patent), issued 2 Aug. 1988, to Franz Neppl, et al., and assigned to Siemens Ag. The '384 patent is believed to disclose an integrated circuit in which FET's formed in respective N-type and P-type wells are provided with a superior latch-up hardness by use of an out-diffusion process in the formation of the wells. There is no teaching nor suggestion in the '384 patent to combine a capacitor with the FET's in order to define a memory cell. No teaching or suggestion appears in the '384 patent to fabricate a DRAM with capacitors situated atop an oxide layer carried on the substrate of the integrated circuit.

Still another conventional integrated circuit of CMOS type is know in accord with U.S. Pat. No. 5,283,203 (hereinafter, the '203 patent), issued 1 Feb. 1994, to Manzur Gill, et al., and assigned to Texas Instruments. The integrated circuit disclosed by the '203 patent may take the form of a static memory device. Each memory cell of the integrated circuit memory device includes a FET type transistor with a source, a drain, a floating gate, and a control gate. Charge is either stored or is not stored on the floating gate of an FET to produce a corresponding non-conductive or conductance state for the particular FET, which is read as either a stored zero or a stored one, respectively. Reading the stored value state (i.e., either one or zero) of a cell does not destroy the stored value. Thus, the memory is static, as opposed to a dynamic memory (DRAM) in which reading the stored content of a memory cell destroys the content. The memory device of the '203 patent does not include in each memory cell a separate capacitor structure upon which charge is stored, and the stored charge level of which is read by interrogating the cell be closing an associate FET transistor switch to conduct the charge externally of the cell.

SUMMARY OF THE INVENTION

In view of the deficiencies of the conventional technology outlined above, a primary object for this invention is to avoid one or more of these recognized deficiencies.

An object for the present is to provide an improved method of making a DRAM memory integrated circuit;

A more particular object for the present invention is to provide an improved method of fabricating memory cell transistors in a DRAM which also includes a capacitor structure associated with each memory cell transistor;

Yet another object for the present invention is to provide an improved method of fabrication such a DRAM memory integrated circuit which includes associated transistors and capacitors for memory cells, and which also includes plural metallization and insulation layers atop the memory cells.

Accordingly, the present invention provides a self-aligning photolithographic method of making a CMOS-technology DRAM having multiple memory cells, each of the multiple memory cells including an FET and a capacitor, the method including steps of providing a substrate of silicon semiconductor material; forming a well of selected polarity in the substrate material; forming in the well of the substrate a spaced apart pair of source and drain implants of like polarity which is opposite to the one well region; forming a gate element atop the substrate aligned between the pair of source and the drain implants to define the FET; embedding the gate element in a heavy layer of oxide atop the substrate; forming a capacitor structure atop the substrate in alignment with one of the source and drain implants; and including in the capacitor structure a conductive one capacitor plate structure with a portion extending through the heavy oxide layer and contacting one of the source and drain implants.

Additional objects and advantages of the present invention will be apparent from a reading of the following detailed description of a particularly preferred embodiment of the invention, taken in conjunction with the following drawing Figures, which are briefly described below.

BRIEF DESCRIPTION OF THE DRAWING FIGURES

FIG. 1 provides a schematic representation of a DRAM memory cell with a charge storage capacitor and a transistor for accessing the memory cell;

Figure 20:
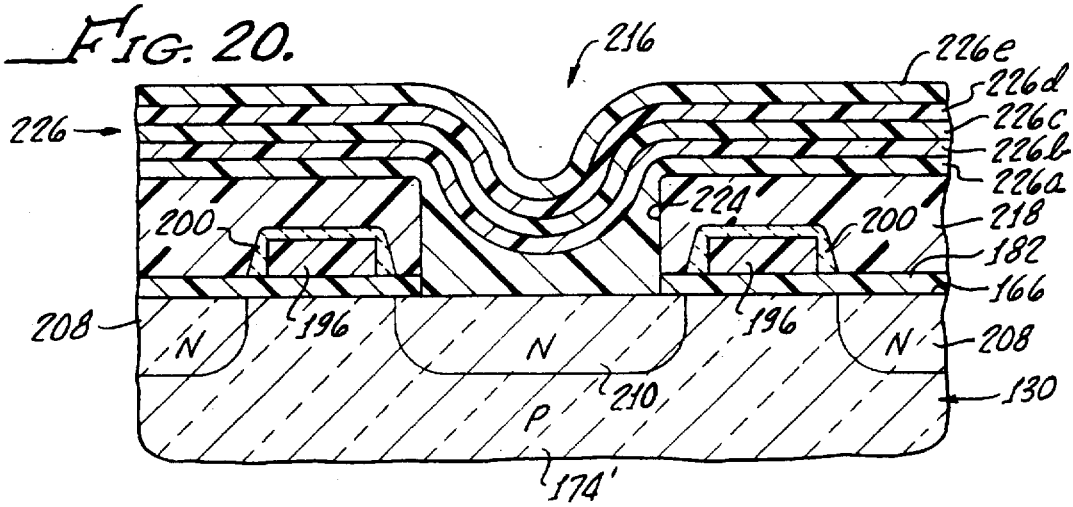
Figure 21:
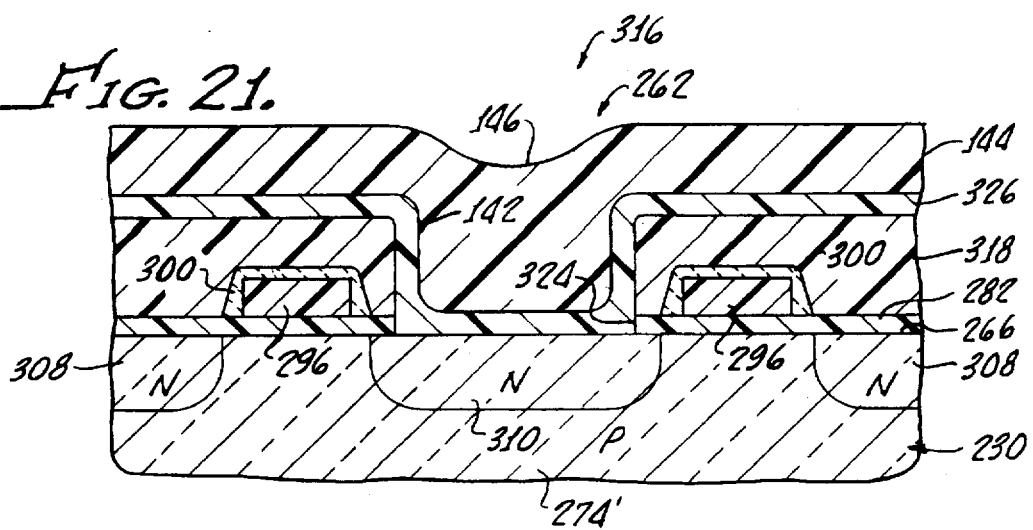
Figure 28:
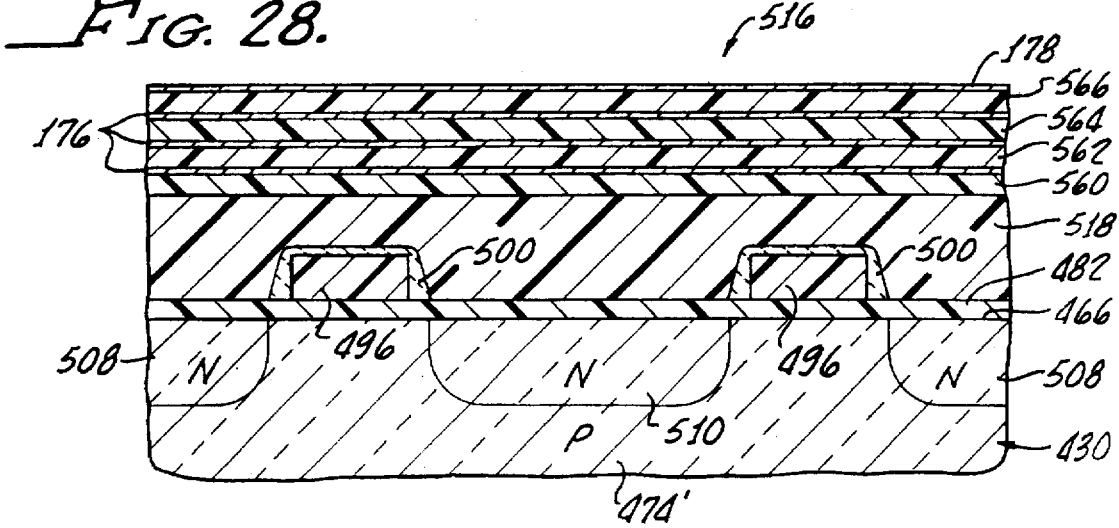
Figure 29:
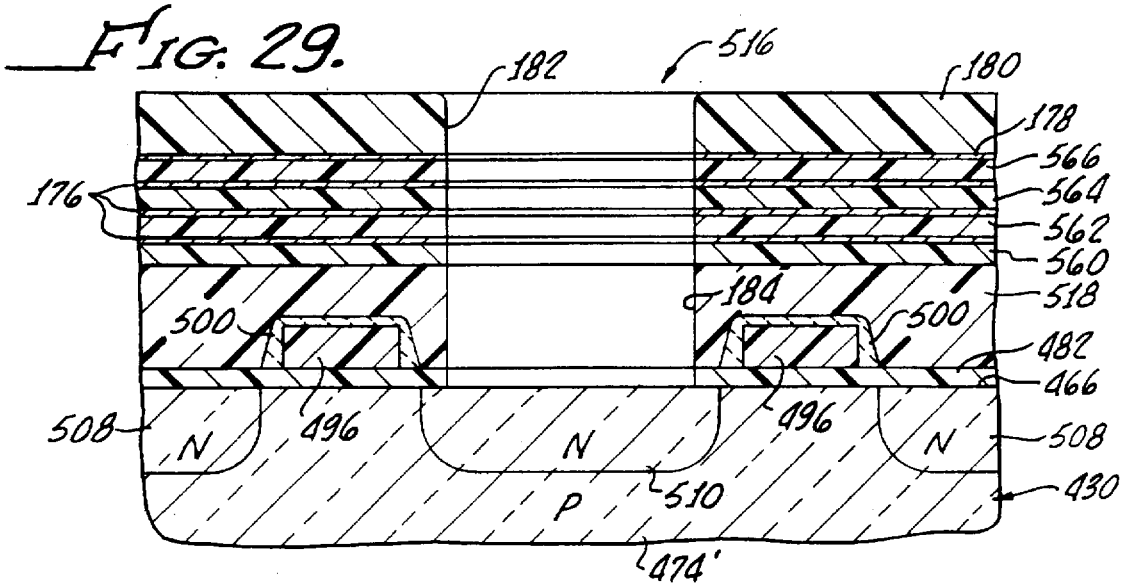
Figure 30:
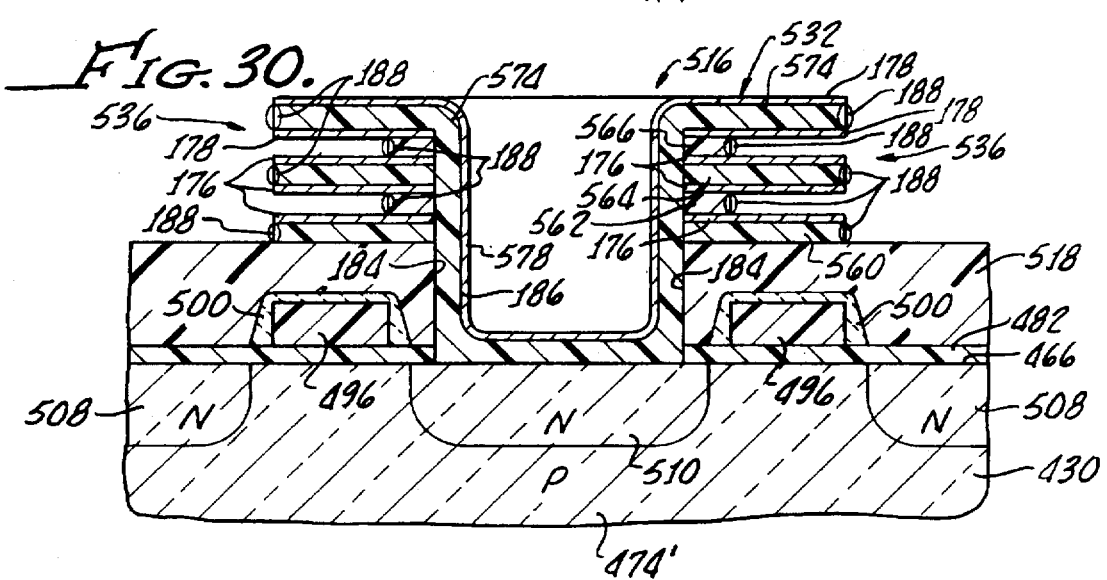

FIGS. 5–12 present greatly enlarged and diagrammatic cross sectional views of a work piece at particular sequential and respective stages of manufacture of a DRAM integrated circuit memory according to the present invention; and each Figure illustrates steps in the method of manufacture of the DRAM;

FIGS. 13–19 present greatly enlarged and diagrammatic cross sectional views of a work piece at particular sequential and respective stages of manufacture of a DRAM integrated circuit memory according to the present invention; and each Figure illustrates steps in the method of manufacture of the DRAM;

FIG. 20 provides a diagrammatic cross sectional view similar to FIG. 15, of a work piece for a DRAM memory integrated circuit according to the present invention, and illustrates steps in the method of manufacture of several alternative embodiments of the DRAM;

FIGS. 21–24 present greatly enlarged and diagrammatic cross sectional views of a work piece at particular sequential and respective stages of manufacture of an alternative DRAM integrated circuit memory according to the present invention similarly to FIGS. 13–19; and each Figure illustrates steps in an alternative method of manufacture of the DRAM;

FIGS. 25–27 also present greatly enlarged and diagrammatic cross sectional views of a work piece at particular sequential and respective stages of manufacture of another alternative DRAM integrated circuit memory according to the present invention similarly to FIGS. 13–19 and FIGS. 21–24; and each Figure of this group illustrates steps in an alternative method of manufacture of the DRAM;

FIGS. 28–30 present greatly enlarged and diagrammatic cross sectional views of a work piece at particular sequential and respective stages of manufacture of yet another alternative DRAM integrated circuit memory according to the present invention similarly to FIGS. 13–19, FIGS. 21–24, and FIGS. 25–28; and each Figure of this group illustrates steps in the respective alternative method of manufacture of the DRAM;

DETAILED DESCRIPTION OF THE EXEMPLARY PREFERRED EMBODIMENTS OF THE INVENTION

An overview

Figures 1, 2:
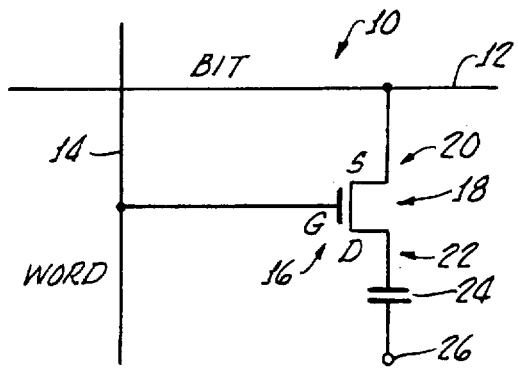
FIG. 2 is a greatly enlarged fragmentary cross sectional view through a memory cell of a DRAM integrated circuit according to the present invention.

Viewing FIG. 1, a memory cell 10 of a dynamic random access memory (DRAM) is schematically depicted. Those ordinarily skilled in the pertinent arts will recognize that, schematically, the memory cells and dummy cells of a DRAM are the same. Physically, the memory cells and dummy cells may be the same or may be distinguishable from one another by opposing polarities of the associated FET transistors of the cells. When a bit-value is stored on such a cell, the charge value for a one or a zero is stored on the memory cell, and the charge value for one-half of one is stored on the associated dummy cell. Later, when the memory cell is interrogated, the charge values of both the memory cell and the dummy cell are read simultaneously. The sign of the difference between these two stored charges indicates whether the stored value was a one or a zero. Alternatively, a DRAM may include only memory cells, without paired dummy cells, and center-point sensing may be used to determine whether a one or zero is stored on a particular cell when the cell is interrogated. That is, the voltage perturbation occurring on a pre-charged trace to which a particular cell is connected when its associated FET is closed is a comparison of the voltage stored on the capacitor of the cell to the reference (or center point) voltage maintained on the trace, and is an indication of whether the memory cell stored a one or a zero. Memory cell 10 includes associated portions of respective bit and word lines 12 and 14. The word line 14 is connected to a gate 16 of a FET transistor 18, while the bit line 12 is connected to one of the source and drain 20, 22 of the transistor 18.

The source and drain of a FET transistor are effectively interchangeable, and the identification of these features is an indication of current flow direction. Accordingly, the schematic representations for a memory cell and dummy cell are the same. Preferably, the FET's of the memory cells will be NMOS, because of the speed advantage over the PMOS FET's. However, PMOS FET's will be present in the integrated circuit as part of the peripheral support (read/write, clock, address, and amplification) circuitry sections of the DRAM memory device. Alternatively, the memory cells of a CMOS DRAM may be based on PMOS FET's, or may include both NMOS and PMOS FET's. Those ordinarily skilled in the pertinent arts will recognize that memory cells are ordinarily paired with dummy cells for purposes of circuit symmetry and ease of design of reading amplifiers for the DRAM. The FET 18 controls charge storage and charge reading on one plate of a capacitor 24. The other plate of the capacitor 24 is connected to a memory enable node 26, which is a common connection among the multitude of memory cells of a DRAM.

Figure 3:
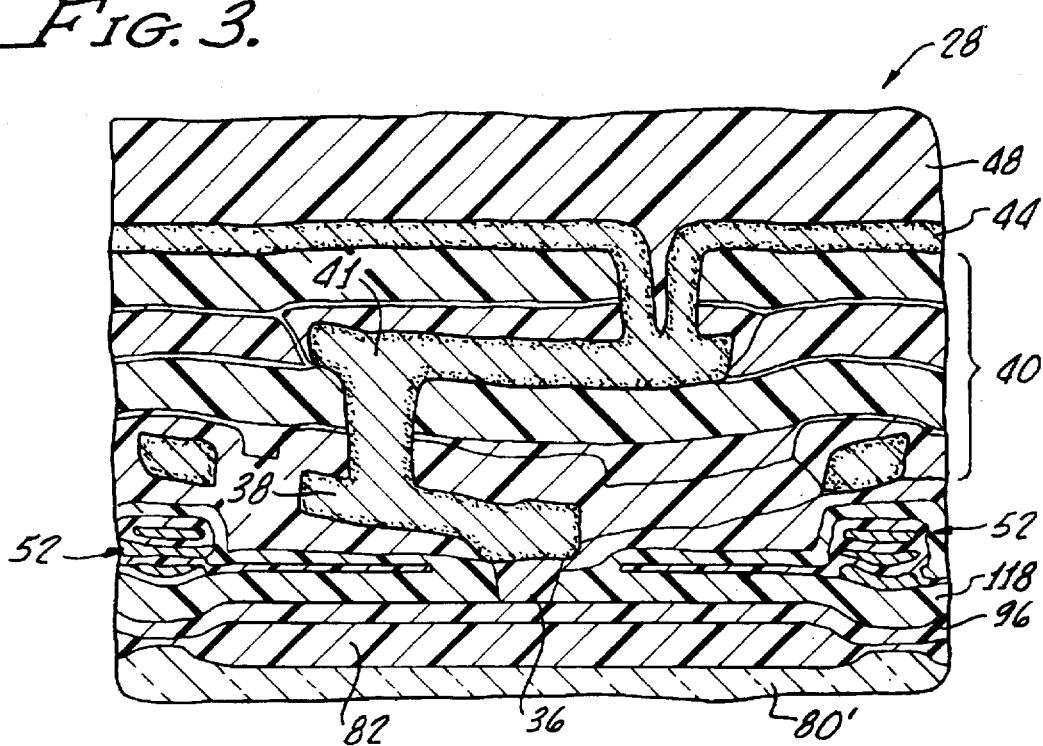
FIGS. 3 and 4 are similar enlarged fragmentary cross sectional views taken generally along the indicated planes of FIG. 2.
Figure 4:
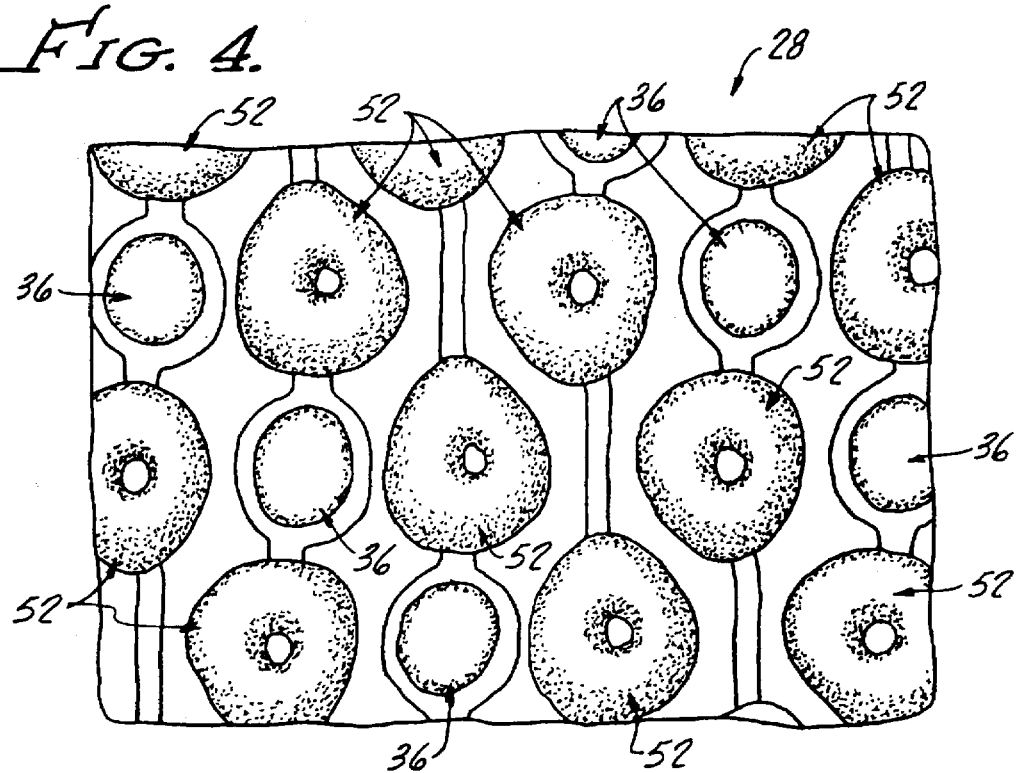

FIGS. 2, 3, and 4 show two respective transverse and a plan cross sectional view taken through a DRAM integrated circuit structure 28 resulting from practice of the method of the present invention. DRAM structure 28 includes a silicon substrate 30 within which is formed the FET's of the memory cells. Preferably, the substrate 30 is P-type silicon. Upon the silicon substrate 30 is carried a heavy composite layer 32 generally of silicon oxide. This oxide layer 32 defines openings 34 through which pass respective plugs 36 of conductive polysilicon. In each case where polysilicon is used in fabrication the structure of the DRAM 28, those ordinarily skilled in the pertinent arts will recognize that amorphous silicon could be substituted for the polycrystalline silicon. This is true generally in all instances, except as is pointed out below where amorphous silicon and polysilicon are used together and the difference between the isotropic etching rate of the amorphous silicon and polysilicon is used to define a feature of the capacitors 24. The conductive plugs 36 are effective to connect features formed near the interface of the silicon substrate 30 and heavy oxide layer 32 with respective traces formed in a first layer of metallization 38. Atop the first layer of metallization 38 is formed several layers of insulation, including oxide and inter-level dielectric materials, all collectively referenced with the numeral 40. Within this layer of materials is formed a second layer of metallization, generally referenced with the numeral 41. Atop the layers of insulation 40 is formed a layer 42 of oxide, which includes conductive metal traces 44, forming bit, word, and other necessary interconnections within the DRAM 28. Closer examination of the layer 42 will show that it also includes inter-layer dielectric materials 46. Finally, atop the layer 42 is formed an additional layer 48 of oxide, and a top layer 50 of passivating silicon nitride.

Embedded within the thick oxide layer 32 are multiple capacitor structures, generally indicated with the numeral 52. These capacitor structures 52 are generally disk-like, and are generally circular in plan view, viewing FIG. 4, although other configurations such as rounded triangular shapes in plan view, for example, may be used for these capacitor structures. Each of these capacitor structures 52 includes an inner annular capacitor plate structure 54 preferably formed at least in part of conductive polysilicon, and which includes plural annular fins 56 extending outwardly. The inner capacitor plate structure 54 may be formed of other materials, as will be further described below. Insulating the fins 56 is a layer of dielectric, generally indicated with the numeral 58. Around the dielectric 58 and plate structure 54, as well as between the fins 56, is an outer plate structure 60 formed of conductive polysilicon.

The structures and features of the DRAM illustrated by FIGS. 2–3 are preferably as follows: Metallization 38 is preferably tungsten, as is metallization 41 as well. The gates 16 of the FET transistors 28 have a length of 0.35 µm, while the memory cells have a pitch of 0.9×1.8 µm. Metallization is used to form the traces 44, and is preferably composed of silicon doped aluminum on a tungsten barrier metal. $P^+$, and $N^+$ implantations are used for the sources and drains of the respective FET's 18.

Method of Making Self-Aligned Twin-Wells in a DRAM Structure

Turning now to FIGS. 5–11, steps in the method of making the FET's 18 are illustrated. Viewing first FIG. 5, a portion 62 of the silicon substrate 30 which is to become the site of at least one of the FET's 18 is depicted. A layer 64 of oxide is formed on the surface 66 of the substrate 30. The layer 64 of oxide may be formed using a thermal oxidation process, or may be deposited by use of CVD, for example. Atop the layer 64 of oxide is formed a layer 68 of silicon nitride.

FIG. 6 shows that the layer 68 of silicon nitride is patterned using a layer 70 of photoresist, which is similarly exposed in a corresponding pattern and partially removed. Thus, a portion of the site 62 is exposed (although this portion is still covered by the thin oxide layer 64). Subsequently, as is depicted in FIG. 6 with the arrows 72, an ion bombardment implantation (or diffusion) process is conducted to implant a shallow subsurface region 74 of the substrate 30 with appropriate ions for forming a selected one of a necessary P-well and N-well. Those ordinarily skilled in the pertinent arts will recognize that the ion bombardment 72 (or diffusion) is conducted over the entire upper surface of the substrate 30, and is not localized as may be suggested by the constraints of illustration as seen in FIG. 6. As depicted in FIG. 6, the implantation for well 74 is of an ion species of a P-type. This implantation or diffusion is conducted through the thin oxide layer 64. However, the photoresist 70 and silicon nitride layer 66 together form an effective barrier against the implantation of the selected one ion species into the part of substrate 30 which is still covered.

Subsequently, as is illustrated by FIG. 7, the photoresist layer 70 is removed, and the substrate 30 is exposed to a thermal oxidation process. The heat and oxidant of this thermal oxidation process causes the ions implanted into region 74 to diffuse through the silicon substrate material 30 so that a well 74' of the selected P-type or N-type is created. As depicted, well 74' is of P-type. Well 74' will also spread somewhat laterally with respect to the location of the implant 74. Also, the thermal oxidation process causes the thin oxide layer 64 to grow thick where it is not covered by the silicon nitride layer 68, and even to grow under this nitride layer somewhat. This thickened layer of silicon oxide is indicated with the numeral 64'. It will be understood that when the oxide layer 64 is not included, the silicon of the substrate itself will be oxidized to provide the thick oxide layer indicated with the numeral 64' in FIG. 7. Moreover, even when oxide layer 64 is included, the silicon of the substrate 30 will be involved in the growth of the thick oxide layer 64' so that some of the silicon of the substrate 30 is consumed, and the surface 66 defines a basin over the P-well 74', or defines a step up from this basin at the perimeter of this P-well. The thermal oxidation process may cause an incidental thin layer of oxide to form atop the nitride layer 68. This incidental oxide layer is indicated on FIG. 7 with the arrowed numeral 76, and is easily removed with an etching process.

FIG. 8 shows that the thick silicon nitride layer 68 is then removed, for example by the use of chemical etching, so that the part of substrate 30 at site 62 which had previously been covered is now exposed (although still covered by the thin oxide layer 64. The thick oxide layer 64' will have spread laterally as was seen in FIG. 8 so that the well 74' is substantially covered. An implantation (or diffusion) process, indicated by arrows 78, is conducted to implant a shallow subsurface region 80 of the substrate 30 with appropriate ions for forming the other one of the necessary P-well and N-well. As before, the limitations of illustration are not intended to indicate that only a localized ion bombardment or diffusion is conducted. Those ordinarily skilled will recognize that the bombardment or diffusion effects the entire upper surface of the substrate 30. As depicted in FIG. 8, the implantation 80 is of N-type. This implantation or diffusion is conducted through the thin oxide layer 64. However, the thick oxide layer 64' forms an effective barrier against the implantation of the ions into the well 74'.

Figure 9:
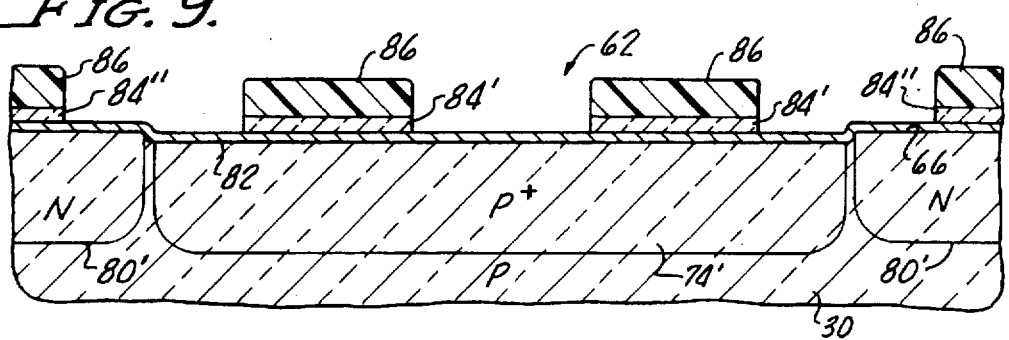

Subsequently, the oxide layer 64 (and 64') is removed, and another thermal processing step is used to effect the diffusion of implant 80 to form a well, which well is indicated on FIG. 8 with the numeral 80' and the dashed line to indicate the size of this well. It is understood that dopant ions diffuse at different rates during thermal diffusion processes. That is, even though the P-well 74' has been exposed to two thermal diffusion processes (one for growing the thick oxide layer 64' and diffusing the implant 74 to well 74', and another for diffusion of the N-well implant 80), the N-well will still generally have a greater diffusion into the material of the substrate 30. Also, the upper surface (still referenced with the numeral 66) will exhibit a step into a basin or recess at the P-well 74'. This step is created, as explained above, because some of the silicon substrate material is consumed in forming the thick oxide portion 64', as was pointed out above, and is subsequently stripped away with the oxide layer 64, 64'. Also, the thermal diffusion process for the N-well 80' may be used to perform a thermal oxidation process effecting a comparatively thin uniform oxide layer 82 on the surface 66, which is best seen in FIG. 9. That is, the thin oxide layer 82 is of substantially uniform thickness over both the P-well 74' and the N-well 80'.

Method of Making Source and Drain Implants with Channel Stops in a DRAM Structure FIG. 9 illustrates the next subsequent phase in the making of a DRAM integrated circuit according to the present method—that phase of forming the source and drain implantations for the FET's. FIG. 9 is centered at one of the P-wells 74' rather at the transition between a P-well and N-well, as were FIGS. 5–8. Those ordinarily skilled in the pertinent arts will recognize that corresponding structures are produced by corresponding steps at the N-wells of the DRAM 28, except as explained below. FIG. 9 shows the substrate 30 with wells 74' and 80' upon which a layer 82 of oxide and a layer 84 of silicon nitride have been deposited. The layer 84 of silicon nitride has been patterned with photoresist 86, and has been partially removed (as by chemical etching, for example) to leave paired segments 84', 84" in each one of the respective wells 74' and 80'. The location of the segments 84' is the future site for the source and drain of an P-channel FET, while the location of the segments 84" is the future site for the source and drain of a respective N-channel FET, recalling the symmetry of circuitry explained above for the DRAM circuit 28.

Figure 10:
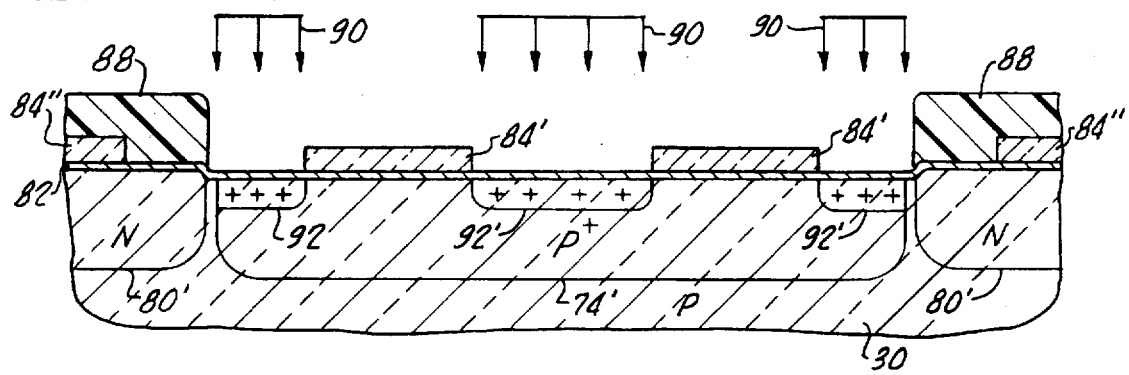

FIG. 10 shows that a layer 88 of masking material is applied over the structure seen in FIG. 9, is patterned, and is partially removed to uncover the P-wells while masking the N-wells. An implantation process, indicated by arrows 90, is conducted to implant a sub-surface channel stop region 92 of the P-well 74' with appropriate ions for forming more highly doped P$^{++}$-type channel stops for the future N-channel FET's in the P-well 74'. Again, the limitations of the illustration are not intended to indicated that this ion implantation is localized. This implantation or diffusion is conducted over the entire upper surface of the substrate 30 and through the thin oxide layer 82. However, the nitride layer 84 and the mask layer 88 each form effective barriers against the implantation of the ions into the covered portion of the P-well 74', and into the N-well 80'.

Figure 11:
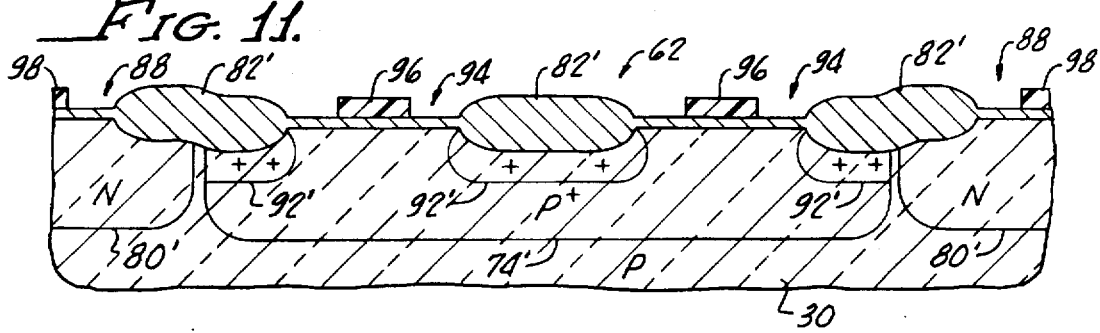

FIG. 11 illustrates that the mask layer 88 is subsequently removed and that a following thermal oxidation and diffusion process results in the growth (thickening) of the oxide layer 82 between the segments 84', 84" of nitride to form thick thermal oxide portions 82', and also to diffuse the more highly doped P$^{++}$-type channel stop implantations 92 to form the channel stops 92' for the future N-channel FET's in the P-well 74'. This Figure also shows that the segments 84', 84" have been removed to leave plateaus 94 over each of the P-well 74', and N-well 80'. Centered upon each plateau 94 is a respective deposition 96, 98 of polysilicon, which will become the gate of the further future FET's (the depositions 98 over the N-wells 80' being shown only fragmentarily).

Figure 12:
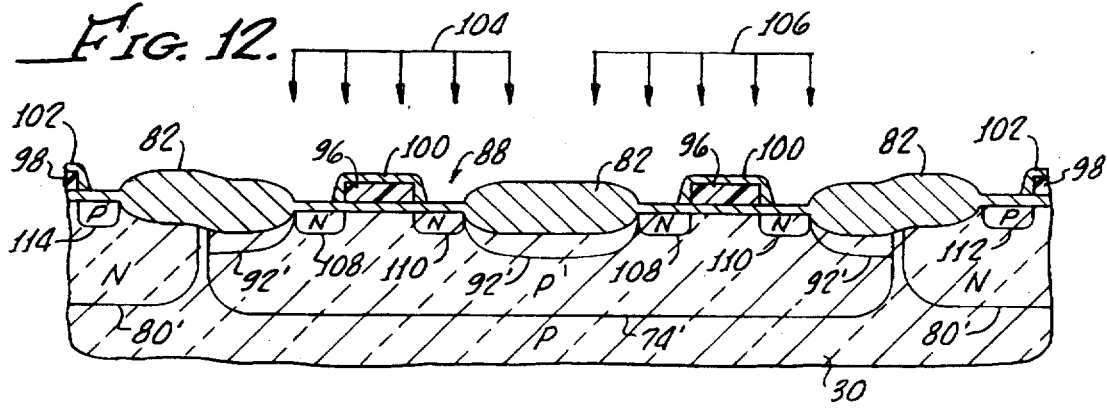

FIG. 12 depicts the addition of respective oxide covers 100, and 102 over the gates 96, and 98. Two subsequent implantation steps, one performed for the P-well and one for the N-well, and respectively indicated with the arrows 104 and 106, form the respective source and drain regions 108, 110, and 112, 114, respectively, in the P-well, and in the N-well. Those ordinarily skilled in the pertinent arts will recognize that the implantation steps 104 and 106 are performed separately with appropriate masking (with photoresist, for example), which is not shown in FIG. 12, so that the implantations for the sources and drains in each of the P-well and N-well do not interfere with or cross contaminate one another.

Formation of the Capacitors 18 in a DRAM Structure

Turning now to FIGS. 13–30, steps in the alternative methods of making one of the multitude of capacitors 52 are illustrated. It will be understood that the steps carried out to fabricate one of the multitude of capacitors 52 result also in the structuring of all of these capacitors. Also, for purposes of simplicity of illustration, FIGS. 13–30 are presented as though the substrate 30 provided a flat or planar surface upon which to further fabricate the capacitors 52. Recalling FIGS. 1–12, it can be seen that the surface of substrate 30 is not truly flat. However, the deviation of substrate 30 from flatness or planarity is not detrimental to the processes described below, or to the resulting DRAM structure.

Viewing first FIG. 13, a portion 116 of the silicon substrate 30 which is to become the site of at least one of the capacitors 52 is depicted. The substrate 30 has a pre-formed P-well 74', with pre-formed N-type implantations 108, 110, as described above. The N-type implantations 108, 110 will become the sources and drains of respective P-channel FET's of the DRAM 28, as will be seen. The DRAM 28 also includes similar N-wells 80', with counterpart P-type implantations 112, 114 to form N-channel FET's for circuit symmetry (not seen in FIG. 13), recalling the description above of FIGS. 1–12. The P-well and N-well, as well as P-type and N-type implantations are indicated also with the respective characters "P", and "N". A layer 82, 82' of oxide is formed on the surface 66 of the substrate 30, only the uniform thin portion 82 of the layer 82/82' being seen in FIG. 13. The layer 82, 82' of oxide may be formed using a thermal oxidation process as was explained above, or may be deposited by use of CVD, for example.

Atop the layer 82 of oxide, and atop the polysilicon gates 96, are formed respective oxide covers 100 as was also pointed out above (the oxide gate covers 102 of the N-well not being seen in FIG. 13). A thick layer 118 of oxide is formed over the layer 82, gates 96, and covers 100. A layer 120 of photoresist is applied over the layer 118 of oxide, and is patterned and partially removed to leave an opening 122 aligned with an underlying one of a source or drain implantations 108, 110 (also indicated with the character "N" in the drawing Figures) within the substrate 30. Recalling the schematic representation of the DRAM memory cell presented in FIG. 1, it will be appreciated that the implantation with which the opening 122 aligns is a source or drain for one of the FET's 18.

An anisotropic etching operation is performed to produce a hole 124 (best seen in FIG. 14) through the layers 82 and 118 of oxide to the surface 66 of the substrate 30. The photoresist 120 is removed, and a layer 126 of polysilicon is deposited over the layer 118 of oxide and into the hole 124. Thus, it will be understood that the polysilicon layer 126 makes contact with the N-type implantation in the underlying substrate 30 (or with a P-type implantation in the case of N-channel FET's). As depicted, the implantation 110 is contacted by the layer 126 of polysilicon.

FIG. 15 shows that plural sequential ion implantations are subsequently conducted over the entire upper surface of the substrate 30, as is indicated by the arrowed numerals 128 and 130. For simplicity of illustration, the implantation arrows 128 and 130 are shown over only a portion of the substrate 30. However, these implantations actually are affected over the entire extent of the layer 126 as has been pointed out above. These ion implantations are conducted at different energy levels, as is indicated by the differing lengths of the respectively referenced arrows. By using differing energy levels for the ion implantations, the ions of the implanted material are driven to different depths into the polysilicon material of the layer 126. However, the implanted ions of a particular implantation are driven to substantially similar depths in the polysilicon material of layer 126. Consequently, distinct sub-layers of doped and un-doped (or relatively more heavily and more lightly doped) polysilicon are created in the layer 126. These sub-layers are referenced on FIG. 15 with the numerals 126a through 126e. The sub-layers 126b and 126d are the more highly doped sub-layers.

Next a layer of photoresist (not shown) is applied, patterned, and partially removed to leave a generally circular area of photoresist centered around the hole 124. Subsequently, the portion of polysilicon layer 126 which is not covered by the circular area of photoresist is anisotropically etched away, leaving the structure seen in FIG. 16. For example, the anisotropic etching operation may be conducted using reactive ion etching (RIE), to create substantially vertical side walls on the structure seen in FIG. 16. In plan view this structure above the layer 118 of oxide is preferably generally circular, but may have other alternative plan-view shapes such as elliptical or triangular, for example, recalling FIG. 4. FIG. 17 shows that a subsequent isotropic etching operation preferentially and partially removes the doped sub-layers 126b and 126d. Consequently, as FIG. 17 illustrates, one generally circular, somewhat annular capacitor "plate" structure 132 formed of alternating sub-layers of doped and un-doped (or more heavily and more lightly doped) polysilicon is left atop the oxide layer 118. This one capacitor plate structure 132 includes a stem portion 134 extending through the hole 124 in the layers 82 and 118 of oxide to make electrical contact with the N-type implantation 108 or 110 (or with a P-type implantation 112 or 114 as pointed out above), and was generally referred to with the numeral 52 in FIG. 2. The capacitor plate structure 132 also includes plural annular and radially outwardly extending individual fins 136, which were generally referred to with the numeral 56 in FIG. 2.

FIG. 18 illustrates that a thin covering insulative layer 138 of dielectric material is deposited over the one capacitor plate structure 132 and between the fins 136. The dielectric material of the layer 138 conformably coats all exposed conductive surfaces of the one capacitor plate structure 132. This dielectric material may be formed by thermal oxidation, CVD, or MBE processes, for example. Further, a material such as tantalum pentoxide may be used as the capacitor dielectric material of layer 138.

Figure 19:
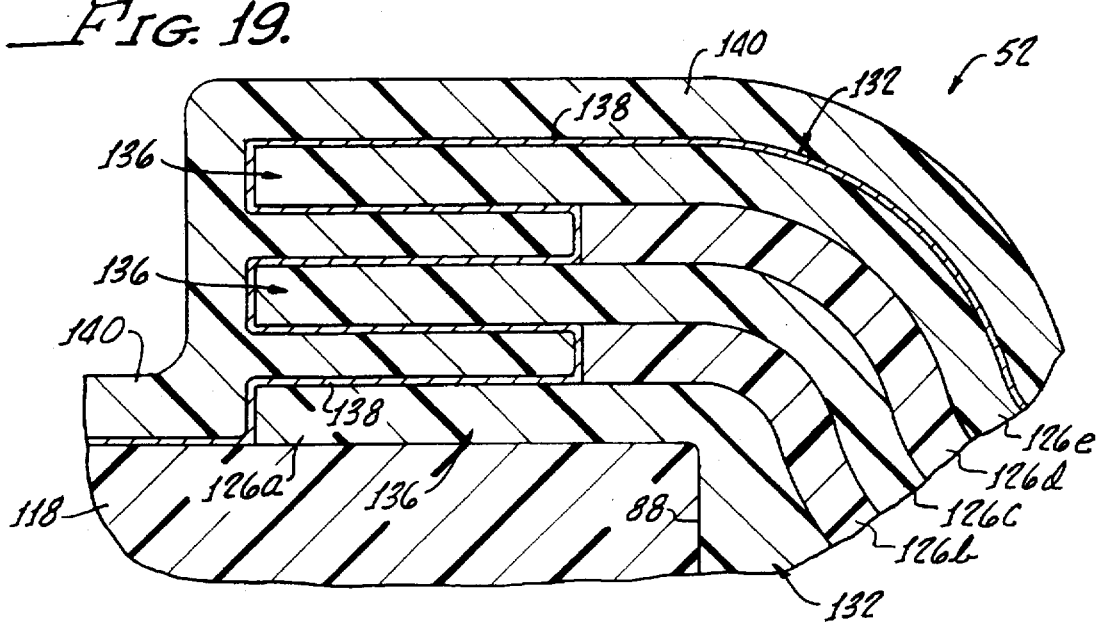

FIG. 19 shows that after the layer 138 of capacitor dielectric material is applied conformably over the capacitor one plate structure 132, another layer 140 of polysilicon is conformably applied over the structure 132, and between the fins 136. This layer 140 of conductive polysilicon forms the other "plate" structure of the schematic capacitor 24 seen in FIG. 1, and is common to all of the multitude of capacitors of the DRAM 28. In FIG. 2, this common capacitor plate layer 140 can be seen as the outermost layer of the capacitor structures 52, which was generally indicated with the arrowed reference numeral 60.

FIG. 20 illustrates a work piece according to an alternative embodiment of the present invention at an intermediate stage of manufacture. In order to obtain reference numerals for use in describing this alternative method of making the capacitors 24 of the DRAM 28, features which are the same or analogous in structure or function to features described above are referenced with the same numeral used above and increased by 100. FIG. 20 depicts a structure which is similar to that seen in FIG. 15. However, the alternating layers 226a-226e of the embodiment seen in FIG. 20 are not achieved by use of ion implantation. Instead, the layer 226 is deposited in plural steps as a series of alternating layers one atop the other. Alternate layers 226 a-e are formed of alternate ones of selected pairs of materials. These material pairs are selected for their different etching rates during isotropic etching. More particularly, alternate ones (i.e., layers 226b and 226d) of the layers in layer 226 are formed of doped (or are more highly doped) material. The other layers a-e of layer 226 are either not doped (or are more lightly doped), respectively. Alternatively, the alternate layers a-e of the layer 226 are formed of other material pairs which isotropically etch at differing rates. After the structure seen in FIG. 20 is formed in this way, the remainder of the manufacturing process is conducted as explained with reference to FIGS. 13–19.

FIG. 20 may also illustrate additional alternative embodiments of the present invention at the same intermediate stage of manufacture. One alternative embodiment of the present invention involves depositing the layer 226 as alternating layers of amorphous and poly-crystalline silicon. That is, the layers 226b and 226d are formed of poly-crystalline silicon, while layers 226a, 226c, and 226e are formed of amorphous silicon. With this structure, the subsequent isotropic etching operation is performed selectively to the poly-crystalline silicon of layers 226b and 226d, to leave essentially the structure seen in FIG. 16, but having fin portions of amorphous silicon. Still alternatively, the alternating layers of layer 226 may be formed of alternating layers of silicon and silicon/germanium. With this structure, the isotropic etching operation is performed selectively to the composition of one of the alternating different layers of layer 226. If desired, the structure may be partially oxidized, and an etchant which is selective to the oxide composition may be used to carry out the isotropic etching operation. That is, the one capacitor plate structure 132 alternatively may be formed of alternate layers of amorphous silicon and silicon oxide (i.e., partially oxidized silicon); or of alternating layers of amorphous silicon and polysilicon, either one of which may be partially oxidized. The essential nature of the alternate layers of material of the one capacitor plate structure 132 is that they isotropically etch at differing rates.

FIGS. 21–24 illustrate steps in another alternative method of making a DRAM in accord with the present invention. In order to obtain reference numerals for use in describing this alternative method of making the capacitors 24 of the DRAM 28, features which are the same or analogous in structure or function to features described above are referenced with the same numeral used above and increased by 200. In this embodiment, the polysilicon layer 326 is comparatively thinner, and is conformal to the surface of the oxide layer 318, including the hole 324. Consequently, the polysilicon layer 326 also defines a recess 142 aligned with the hole 324. Over the layer 326 of polysilicon is formed a thick layer 144 of oxide. The thick oxide layer 144 still has a recess 146 aligned with the hole 324, although this recess in not as pronounced as the recess 142 because of the thickness of this oxide layer.

Figure 22:
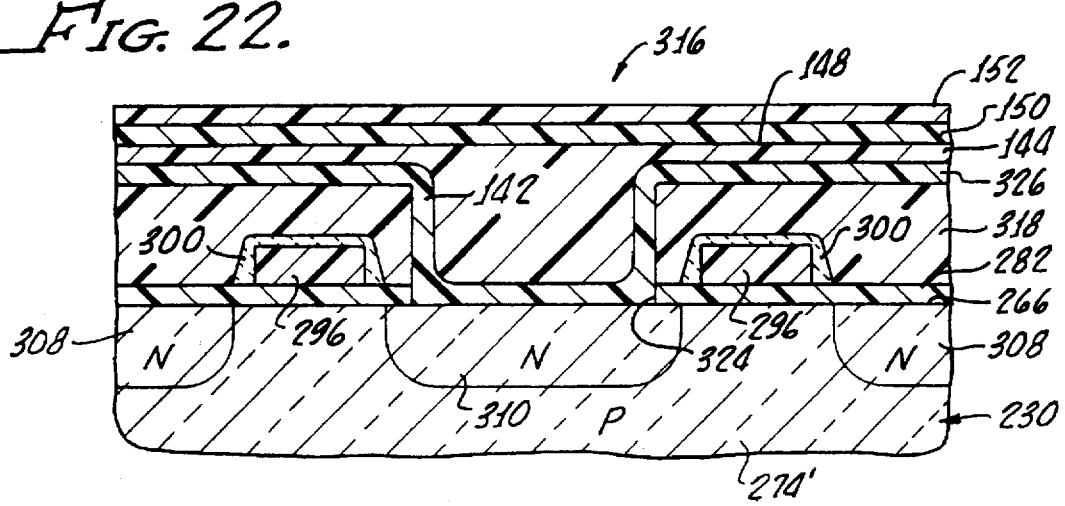
Figure 23:
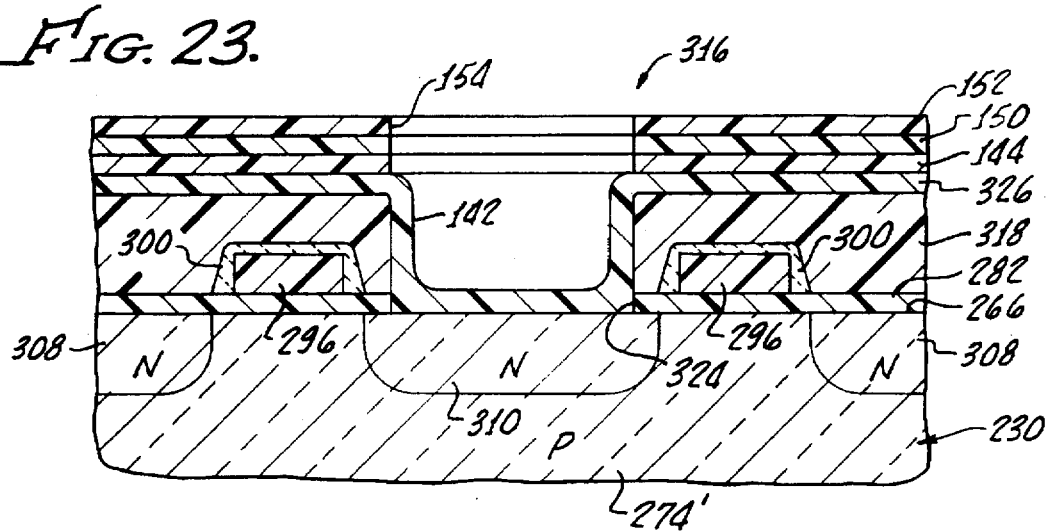
Figure 24:
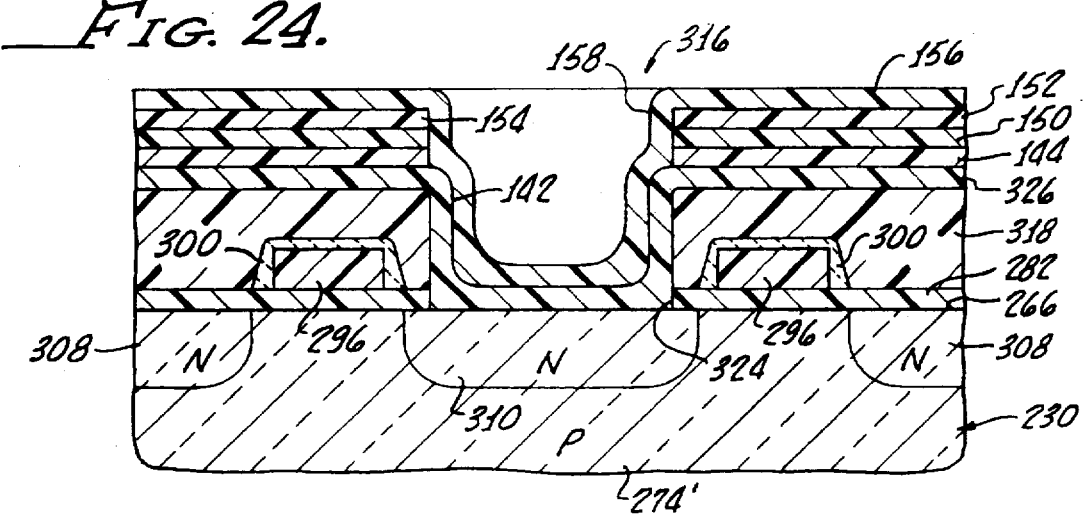

FIG. 22 shows that oxide layer 144 is then planarized to provide a smooth surface 148. This planarizing may be conducted using any of several available technologies. For example, the planarizing of layer 144 may be conducted by etching or by mechanical operations such as lapping or grinding, for example. Atop the planarized layer 144 of oxide is formed a layer of polysilicon 150, and a subsequent layer 152 of oxide. A layer of photoresist (not shown) is than applied, patterned, and partially removed to provide a hole in the photoresist layer aligned with the hole 324. FIG. 23 illustrates that a subsequent anisotropic etching operation provides a hole 154 through the layers 144, 150, and 152, down to the polysilicon layer 326. FIG. 24 shows that subsequently a conformal layer 156 of polysilicon is formed over the layer 152, and into the hole 154 to contact the polysilicon layer 326. This conformal polysilicon layer 156 defines a recess 158, which recess will be central of the resulting capacitor structure. FIG. 24 illustrates a precursor structure similar to that shown in FIG. 13. Accordingly, subsequent manufacturing steps as illustrated and discussed in connection with FIGS. 14–17 are employed to complete formation of the capacitor 18 of a DRAM 28.

FIGS. 25–27 illustrate steps in another alternative method of making a DRAM in accord with the present invention. In order to obtain reference numerals for use in describing this alternative method of making the capacitors 18 of the DRAM 28, features which are the same or analogous in structure or function to features described above are referenced with the same numeral used above and increased by 300. Viewing FIG. 25, it is seen that upon the oxide layer 418, alternating layers 160, 162, 164, and 166 are formed.

Layers 160 and 164 are preferably formed of polycrystalline silicon, while layers 162 and 166 are formed of oxide. Other alternating layers of the alternate materials set forth above may be used as alternatives to oxide and polysilicon. A layer 168 of photoresist is formed over the layer 166 of oxide, and is patterned and partially removed to define a hole 170, as is seen in FIG. 26. FIG. 26 also shows that an anisotropic etching operation is performed through the hole 170 of photoresist layer 168, through the oxide and polysilicon layers 160–166, through the oxide layers 382, 418, and to the surface 366 of substrate 330, forming a hole 172.

FIG. 27 illustrates that the photoresist layer 168 is subsequently removed, and that a conformal layer 174 of polysilicon is formed over the oxide layer 166 and into the hole 172, contacting the N-type implantation 410 in substrate 330 at surface 366. The layer 174 of polysilicon electrically connects the layers 160, and 164 together so that the one capacitor plate structure so formed includes plural annular "plates" which are connected electrically to one another similarly to the structures described above. The resulting structure is similar to that depicted in FIG. 13, and subsequent processing steps as depicted in FIGS. 14–17 are utilized to complete the structure of capacitor 18 for DRAM 28.

FIGS. 28–30 illustrate steps in yet another alternative method of making a DRAM in accord with the present invention. The embodiment of FIGS. 28–30 and the methodology of making this depicted structure is similar to the methodology of making a DRAM according to the method of FIGS. 25–27. In order to obtain reference numerals for use in describing this alternative method of making the capacitors 18 of the DRAM 28, features which are the same or analogous in structure or function to features described above are referenced with the same numeral used above and increased by 400. FIG. 28 shows substrate 430 with P-well, and N-type implantations, oxide layer 482, gates 496, and covers 500, and oxide layer 518. Atop the oxide layer 518 is formed alternating layers of poly-crystalline silicon (560, 564), and silicon oxide (562, 566), with each being separated from the next by a thin layer (176) of dielectric material. The dielectric material may be tantalum pentoxide, or other suitable electrically insulative material. Also, the alternating materials of the alternate layers 560–566 may be selected from the alternative material pairs set out above. A similar layer 178 of dielectric material is also formed atop the layer 566 of oxide.

A layer 180 of photoresist is applied over the upper most layer 178 of dielectric material, is patterned, and is partially removed to leave a hole 182 aligned with the N-implantation 510. FIG. 29 shows that an anisotropic etching operation is then performed to create a hole 184 extending to the surface 466 of substrate 430. FIG. 30 shows that a layer 574 of polysilicon is then applied conformably over the upper most dielectric layer 176, and into hole 184 forming a recess 186. This layer 574 of polysilicon material electrically connecting with the poly layers 560 and 564. An additional layer 578 of dielectric material is conformably applied over the polysilicon layer 574. This Figure also shows that an insulative oxide portion 188 is formed at the radially outer extent of the fins 536. This insulative oxide portion 188 is effective to prevent electrical contact between the conductive polysilicon layers 560, 564, 574, and an outer conductive layer like the outer poly layer 140 described earlier (recalling poly layer 140 of FIG. 19). Those ordinarily skilled in the pertinent arts will recognize that when the alternating materials of layers 560–566 and 574 are polysilicon and oxide, then oxide portions 188 will not be needed and will not form at the radially outer extent of the layers 562 and 566 because these layers are already formed of oxide. The same is true when the alternating layers are amorphous silicon and silicon oxide. However, when the alternating layers 560–566 and 574 are formed of material pairs such as more heavily doped and more lightly doped amorphous or polysilicon, polysilicon and amorphous silicon, or silicon and silicon germanium, then oxide portions 188 will form on the layers 562 and 566 as well. These oxide portions are depicted in FIG. 30 on the layers 562 and 566 in order to completely illustrate the invention. The dielectric layers 176, and 178 are effective along with the oxide portions 188 to electrically insulate the one capacitor "plate" structure 532 from the outer capacitor "plate" (which is formed by a conductive layer like the polysilicon layer 140, recalling FIG. 19 and using the reference numeral for this conductive layer as seen in the earlier Figure) when this latter "plate" of the capacitor structure is formed.

The resulting structure seen in FIG. 30 is similar to that of FIGS. 18 and 19. Additional steps will be employed to complete the capacitor structure 18 for a DRAM 28. However, the step illustrated in FIG. 19 of forming a conformal insulative dielectric layer (138) over the one capacitor plate structure (132) will not be necessary with the methodology depicted and described with reference to FIGS. 28–30 because the layers 176 and 178 along with oxide portions 188 serve the function of insulating the capacitor "plates" from one another. Additionally, the methodology depicted and described with reference to FIGS. 28–30 has the advantage of providing extremely uniform thicknesses of dielectric (i.e., layers 176 and 178) between the "plates" of the capacitor 18. Consequently, the capacitance values of the multiple capacitors of the DRAM 28 are made more uniform, and charge storage on these capacitors is more durable because the chances are reduced of a thin area of dielectric being present where stored charge could leak away through the dielectric material.

Additional manufacturing steps will subsequently be performed to provide the other features of the DRAM 28 described with reference to FIGS. 2–4.

While the present invention has been depicted, described, and is defined by reference to a particularly preferred embodiment of the invention, such reference does not imply a limitation on the invention, and no such limitation is to be inferred. The invention is capable of considerable modification, alteration, and equivalents in form and function, as will occur to those ordinarily skilled in the pertinent arts. For example, it will be apparent to those ordinarily skilled in the relevant arts that the manufacturing processes used to fabricate the DRAM 28 may be selected to eliminate use of ozone-depleting chemicals from the manufacturing process. That is, use of chemicals on the EPA's 33/50 chemical list may be reduced or eliminated. Particularly, reduced use of ethylene-glycol esters and/or CFC's may be achieved. Moreover, the best available practices may be utilized in the manufacturing of a DRAM according to the present invention. Pursuant to this objective, advanced mix-and-match fabrication applications may be utilized in an advanced high-volume manufacturing environment. This manufacturing environment may include packaging of the resulting DRAM in thin small-outline packages (TSOP's). In advanced mix-and-match fabrication, devices with feature sizes of 0.25 micron, for example, require considerable better stepper resolutions than the current 0.75 to 0.80 micron accuracies. Thus, 5:1 or 4:1 reductions of the stepper increments are employed in critical ares of the devices to proved best accuracies. A 1:1 stepper operation is used in the non-critical areas of the device in order to provide both high quality and fast through-put at a lower cost. In this regard, it should be recalled that the costs of lithography represent about 35% of finished wafer costs. Accordingly, the depicted and described preferred embodiment of the invention is exemplary only, and is not exhaustive of the scope of the invention. Consequently, the invention is intended to be limited only by the spirit and scope of the appended claims, giving full cognizance to equivalents in all respects.

What is claimed is:

1. A self-aligning photolithographic method of making a CMOS-technology DRAM having multiple memory cells, each of said multiple memory cells including an FET and a capacitor, said method comprising steps of:

providing a substrate of silicon semiconductor material;

forming a well of selected polarity in said substrate material;

forming in said well of said substrate a spaced apart pair of source and drain implants of like polarity which is opposite to said one well region, and which cooperatively form therebetween a channel for said FET;

forming a gate element atop said substrate aligned between said pair of source and said drain implants to define said FET;

embedding said gate element in a layer of oxide atop said substrate;

forming a capacitor structure atop said substrate in alignment with one of said source and drain implants; and including in said capacitor structure a conductive one capacitor plate structure with a portion extending through said layer of oxide and contacting one of said source and drain implants;

wherein said step of forming in said well of said substrate a spaced apart pair of source and drain implants of like polarity which is opposite to said well includes steps of:

forming a layer of silicon nitride on said substrate atop said well;

patterning said layer of silicon nitride to define a pair of spaced apart segments of silicon nitride, which pair of segments align respectively with the sites for said source and drain implants;

forming a layer of silicon oxide on said substrate atop said well where the latter is not covered by said segments of said layer of silicon nitride;

removing said segments of said layer of silicon nitride;

forming a gate element on said substrate in alignment between said sites for said source and drain implants; and implanting a source and drain dopant of respective polarity opposite to said one well into said substrate to form said source and drain implants while using said layer of silicon oxide, and said gate element to substantially prevent said substrate from elsewhere being implanted with said source and drain dopant; and further including the step of: forming a cover of silicon oxide over said gate element prior to implanting said dopant for said source and drain implants.

2. The method of claim 1 further including the steps of: prior to forming said layer of silicon oxide on said substrate implanting ions of polarity like to that of said well into a sub-surface channel-stop region of said one well where the latter is not covered by said segments of said layer of silicon nitride; and using said step of forming said layer of silicon oxide to perform a thermal diffusion of said like-polarity ions into said substrate to form said channel-stops.

3. The method of claim 1 wherein said step of forming a capacitor structure atop said substrate in alignment with one of said source and drain implants includes steps of:

providing an opening through said layer of silicon oxide;

forming a conductive metallic trace atop said layer of silicon oxide; and forming a conductive plug member extending through said opening between a feature adjacent said substrate and said conductive metallic trace.

4. The method of claim 3 wherein said step of forming a conductive plug member extending through said opening between a feature adjacent said substrate and said conductive metallic trace includes the step of using polysilicon to form said plug member.

5. The method of claim 1 wherein said step of forming a capacitor structure atop said substrate in alignment with one of said source and drain implants includes steps of:

providing an opening through said layer of silicon oxide;

providing a conformal coating of silicon over said layer of oxide, and into said hole to contact said one source or drain implant; and patterning said conformal layer of silicon to define a part of said one capacitor plate structure and a stem extending from said one capacitor plate structure through said hole to said one source or drain implant.

6. A method of making a CMOS-technology DRAM having a memory cell including an FET and a capacitor, said method comprising the sequential steps of:

providing a silicon substrate having a surface;

providing a well of selected polarity in said substrate;

forming a layer of silicon nitride over said substrate at said well;

forming a layer of oxide over said substrate at said well;

forming a layer of silicon nitride over said substrate including said well;

patterning said layer of silicon nitride to provide a segment of silicon nitride over each of said well at the future sites of said FET;

forming a layer of silicon oxide over said well where the latter is not covered by said segments of silicon nitride;

removing said segments of silicon nitride to leave plateaus of said substrate covered with said layer of oxide;

forming a localized deposition of conductive material within each plateau to form the gate electrode of the FET which is to be formed;

implanting ions for the source and drain of said FET through said layer of oxide into said substrate to form the source and drain implants of said FET, which cooperatively form therebetween a channel for said FET; and utilizing said layer of silicon oxide and said localized layer of conductive material of said gate electrode to prevent implantation of ions for said source and drain into said substrate where the latter is covered by the layer of oxide and by said conductive material;

further including the step of: forming a cover of silicon oxide over said deposition of conductive material forming said gate prior to implanting said ions for said source and drain implants.

7. The method of claim 6 further including the steps of:

forming said capacitor above said substrate in a layer of insulative oxide with one plate structure of said capacitor connecting with one of said source and drain for said FET.

8. The method of claim 6 wherein said step of patterning said first silicon nitride layer includes steps of:

applying a layer of photoresist over said silicon nitride layer;

exposing and partially removing said layer of photoresist to partially expose said layer of silicon nitride; and etching away said exposed part of said layer of silicon nitride to provide said opening.

9. The method of claim 6 wherein said step of forming a layer of silicon oxide over said first well includes the step of using thermal oxide growth to provide said layer of silicon oxide.

10. The method of claim 6 further including the steps of:

prior to forming said layer of silicon oxide on said substrate, implanting ions of polarity like to that of said well into a sub-surface channel-stop region of said one well where the latter is not covered by said segments of said second layer of silicon nitride; and using said step of forming said layer of silicon oxide to perform a thermal diffusion of said like-polarity ions into said substrate to form said channel-stops.

11. The method of claim 6 further including the step of:

utilizing polysilicon as said deposition of conductive material forming said gate.

12. The method of claim 6 wherein forming of said capacitor includes the steps of:

providing an opening through said layer of silicon oxide;

providing a conformal coating of silicon over said layer of oxide, and into said hole to contact one of said source or drain implant; and patterning said conformal layer of silicon to define a part of said one capacitor plate structure and a stem extending from said one capacitor plate structure through said hole to said one source or drain implant.

13. The method of claim 12 wherein forming of said capacitor includes the further steps of:

providing an insulative material outwardly disposed around said layer of silicon forming said one capacitor plate structure; and applying a conformal layer of silicon forming another plate structure for said capacitor surrounding said one capacitor plate structure.

14. A method of making a CMOS-technology DRAM having a memory cell including an FET and a capacitor, said method comprising the sequential steps of:

providing a silicon substrate having a surface;

forming a well of selected polarity in said substrate;

forming a layer of oxide over said substrate at said well;

forming a layer of silicon nitride over said substrate and said layer of oxide at said well;

forming a layer of silicon nitride over said substrate including said well;

patterning said layer of silicon nitride to provide segments of silicon nitride over said well at the future site of said FET;

implanting ions of polarity like to that of said one well into a sub-surface channel-stop region of said one well where the latter is not covered by said segments of said layer of silicon nitride;

forming a layer of silicon oxide over said substrate where the latter is not covered by said segments of silicon nitride;

using said step of forming said layer of silicon oxide to perform a thermal diffusion of said like-polarity ions into said substrate to form said channel-stops;

removing said segments of silicon nitride to leave plateaus of said substrate covered with said layer of oxide;

forming a localized deposition of conductive material within each plateau to form the gate electrode of the FET which is to be formed;

forming a cover of silicon oxide over said deposition of conductive material forming said gate;

implanting ions for the source and drain of said FET through said oxide layer into said substrate to form the source and drain implants of said transistor, which cooperatively form therebetween a channel for said FET;

utilizing said layer of silicon oxide, said localized layer of conductive material of said gate electrode, and said covers to prevent implantation of ions for said source and drain into said substrate where the latter is covered by said oxide layer, by said conductive material, and by said covers; and forming said capacitor above said substrate in a layer of insulative oxide with one plate structure of said capacitor connecting with one of said source and drain for said FET.

15. The method of claim 14 wherein said step of patterning said first silicon nitride layer includes steps of:

applying a layer of photoresist over said silicon nitride layer;

exposing and partially removing said layer of photoresist to partially expose said layer of silicon nitride; and etching away said exposed part of said layer of silicon nitride to provide said opening.

16. The method of claim 14 wherein said step of forming a layer of silicon oxide over said first well includes the step of using thermal oxide growth to provide said layer of silicon oxide.

17. The method of claim 17 further including the step of:

utilizing polysilicon as said deposition of conductive material forming said gate.

18. The method of claim 14 wherein forming of said capacitor includes the steps of:

providing an opening through said layer of silicon oxide;

providing a conformal coating of silicon over said layer of oxide, and into said hole to contact one of said source or drain implant; and patterning said conformal layer of silicon to define a part of said one capacitor plate structure and a stem extending from said one capacitor plate structure through said hole to said one source or drain implant.

19. The method of claim 18 wherein forming of said capacitor includes the further steps of:

providing an insulative material outwardly disposed around said layer of silicon forming said one capacitor plate structure; and applying a conformal layer of silicon forming another plate structure for said capacitor surrounding said one capacitor plate structure.

\* \* \* \* \*